United States Patent

Ahrons

[15] 3,678,407

[45] July 18, 1972

[54] HIGH GAIN MOS LINEAR INTEGRATED CIRCUIT AMPLIFIER

[72] Inventor: Richard Wilfred Ahrons, Somerville, N.J.

[73] Assignee: RCA Corporation

[22] Filed: March 18, 1970

[21] Appl. No.: 20,522

[52] U.S. Cl. ....................................330/35, 330/18, 330/25
[51] Int. Cl. ..........................................................H03f 3/16
[58] Field of Search ...............................330/18, 35; 307/304

[56] References Cited

UNITED STATES PATENTS

| | | | |
|---|---|---|---|
| 3,516,004 | 6/1970 | Burns | 330/35 X |
| 3,508,084 | 4/1970 | Warner | 307/304 |
| 3,257,631 | 6/1966 | Evans | 307/304 X |

*Primary Examiner*—Roy Lake
*Assistant Examiner*—James B. Mullins
*Attorney*—Eugene M. Whitacre

[57] ABSTRACT

A low power dissipation high load impedance metal-oxide semiconductor field-effect transistor (MOS FET) linear integrated circuit amplifier capable of operation at relatively low power supply voltages with high gain.

12 Claims, 6 Drawing Figures

INVENTOR
RICHARD W. AHRONS
BY Martin Sachs
Attorney

INVENTOR.
RICHARD W. AHRONS
BY Martin Sachs
Attorney

HIGH GAIN MOS LINEAR INTEGRATED CIRCUIT AMPLIFIER

This invention relates to signal translating devices and more particularly to a linear high gain amplifier with low power dissipation operating at low voltages and capable of fabrication on a monolithic integrated circuit substrate or chip.

As used herein; the term integrated circuit refers to a unitary or monolithic semiconductor structure or chip incorporating a network of interconnected active and passive electrical circuit elements such as transistors, diodes, resistors, capacitors, and the like.

In the design of metal-oxide semiconductor field-effect transistor (MOS FET) amplifiers it has been common practice to use a resistor or a MOS FET device as a drain load for the MOS FET amplifier when operating in a common source mode. The resistor drain load introduces distortion and is not used for large output signals. The non-linearity of the MOS FET load complements the non-linear amplifying characteristic of the MOS FET amplifier thus yielding a linear output signal for a given input signal. In order to realize a high voltage gain with an amplifier, employing a MOS load device, the MOS device must be designed to have a relatively high resistance. As a result, either a relatively high supply voltage must be used, or the amplifying MOS FET is required to operate at a low value of current, biased only a relatively small amount above the threshold voltage. The threshold voltage is defined as that voltage which when applied to the gate just permits drain current to flow. With the gate voltage only slightly greater than the threshold voltage, the input signal amplitude that can be accommodated by the common source amplifier without excessive distortion is limited.

Circuits embodying the present invention use a technique wherein the current in the amplifying MOS FET is increased, so that a more favorable operating point is utilized without changing the load resistance, thereby maintaining the relatively high gain of the amplifier. Circuits embodying the present invention utilize a load comprised of several MOS FET devices. One portion of the load comprises a first MOS FET functioning as a resistor, connected in series with a second MOS FET connected as a diode to generate a bias voltage for a third MOS FET. The third MOS FET functions as a constant current source and is coupled in parallel with the first and second MOS FET devices.

Circuits embodying the present invention may be utilized to provide a relatively high gain MOS FET amplifier with substantially equal input and output DC voltage levels capable of being fabricated on a monolithic integrated substrate.

In addition circuits embodying the present invention may be used to provide a relatively high gain MOS FET amplifier operating at a low power supply voltage having low dissipation and equal input and output DC voltage levels capable of being fabricated on a monolithic integrated circuit substrate suitable for operating in cascade with other similar amplifiers.

A circuit utilizing the present invention comprises an amplifying means having a high impedance load which is comprised of a conventional load device and a auxiliary approximately constant current load device. The conventional load and auxiliary load being effectively coupled in parallel so that the current in the amplifying means is the sum of the currents in the conventional and auxiliary loads permitting the amplifying means to operate with a linear relatively high gain and relatively low power dissipation with a relatively low input supply voltage.

For the better understanding of the present invention, together with further objects thereof, reference is made to the following description taken in conjunction with the accompanying drawing wherein.

Figures 1, 2:
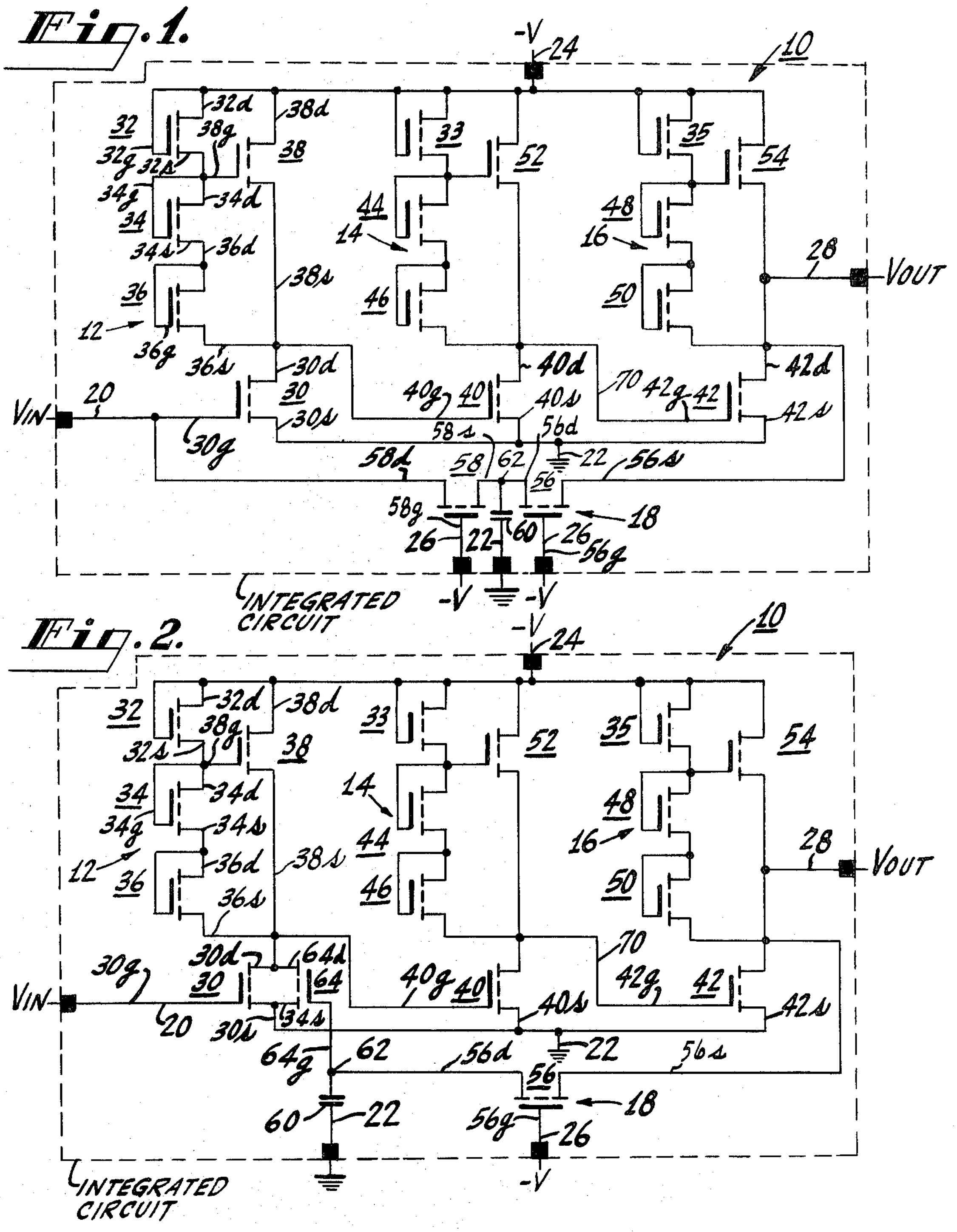
FIG. 1 is a schematic circuit diagram of a three stage MOS FET amplifier.
FIG. 2 is a schematic circuit diagram of an alternate embodiment of a three stage MOS FET amplifier.

Referring to FIGS. 1 and 2 of the drawing, a complete linear amplifier 10 fabricated on a monolithic integrated circuit chip is illustrated. The linear amplifier utilizes high gain MOS FET amplifier stages 12, 14 and 16 in accordance with the present invention. A feedback network 18 also utilizes MOS FET devices.

In the present embodiments of the invention an input signal ($V_{in}$) is applied between terminal 20 and ground reference terminal 22. A relatively low operating supply voltage of approximately 10–15 volts negative with respect to ground 22 is applied at terminal 24 while a supplementary negative bias voltages of approximately 10 volts is applied at terminals 26. An external load (not shown) is connected from output terminal 28 to ground terminal 22 across which output voltage ($V_{out}$) is generated. The substrate (not shown) may be common for all devices and may be connected to ground 22 or the substrate of each device may be connected to its source. These substrate connections have been omitted for clarity.

It is to be understood that although the preferred embodiments show "P" channel enhancement mode insulated gate metal-oxide semiconductor field-effect transistors (IG-MOSFET) other types of field-effect transistors also may be employed. It would be necessary to take the proper precautions to insure that the correct polarity of the supply and supplementary voltages were chosen.

The first amplifying stage 12 operating common source is comprised of an amplifying FET 30, a load impedance comprising FETS 32, 34, 36 and 38. FET's 34 and 36 provide a bias voltage for FET 38. Each FET includes source (*s*), drain (*d*), gate (*g*) and substrate electrodes. The drain **30*d* is connected in common with source 36*s*, source 38*s*, and gate 40*g*. Gate 36*g* is connected in common with drain 36*d* and source 34*s*, while gate 34*g* is connected in common with drain 34*d*, source 32*s*, and gate 38*g*. Gate 32*g* and drain 32*d* as well as drain 38*d* are connected to terminal 24** to which a main operating supply (B−) is applied.

The second amplifying stage 14 and third amplifying stage 16 are similar to the first stage 12 wherein the amplifying FET's are 40 and 42 respectively and the load FET's are 33, 44, 46, 52, and 35, 48, 50, 54 respectively. FET's 44, 46, and 48, 50 provide bias voltage for the constant current load sources 52 and 54 respectively.

Each of the amplifying stages 12, 14 and 16 is connected in the same manner, with the input signal for each stage being connected to the gates **30*g*, 40*g* and 42*g* respectively. The source electrodes 30*s*, 40*s*, and 42*s* are connected in common to ground terminal 22**.

DC feedback is provided from output terminal 28 through FET's 56 and 58 and to input terminal 20. A capacitor 60 is connected from the junction 62 of the source of FET 58 and the drain of FET 56 to ground 22. The capacitor 60 may be connected externally or may be made directly on the substrate if a small capacitance is required. A supplementary bias voltage (−V) is applied at terminals 26 and determines the impedance across the source-drain terminals of FET's 56 and 58 thereby providing means for adjusting the amount of feedback.

A signal applied between terminal 20 and ground 22 is amplified and inverted by amplifier stage 12. Amplifier stage 14 further amplifies and inverts the output of FET 30, while amplifier stage 16 amplifies and again inverts the output of FET 40. The output signal, amplified by the product of the gains of amplifiers 12, 14, 16, appears between terminal 28 and ground 22 and is inverted with respect to the input signal provided at terminal 20. Negative feedback is obtained by coupling the output signal through FET's 56 and 58 where the supplemental voltage between terminals 26 and 22 determines the amount of negative feedback obtained. Capacitor 60 and the capacitance of the MOS gate 30*g* of FIG. 1 or 64*g* of FIG. 2 determine the roll-off frequency for the negative feedback.

The manner in which the amplifier stages 12, 14, and 16 operate and how such amplifier stages compare to FET amplifiers known in the art will now be discussed.

Figure 3A:
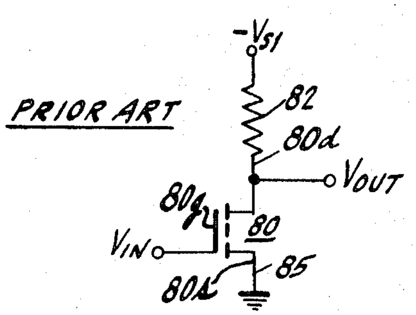
FIG. 3A is a schematic circuit diagram of a MOS FET amplifier with a resistive load.
Figure 3B:
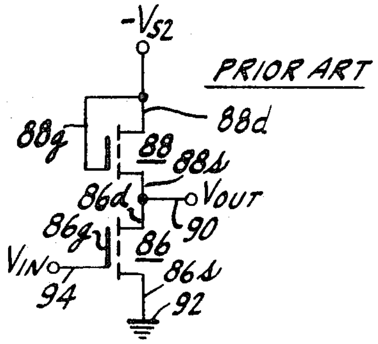
FIG. 3B is a schematic circuit diagram of a MOS FET amplifier with a MOS FET load.
Figure 3C:
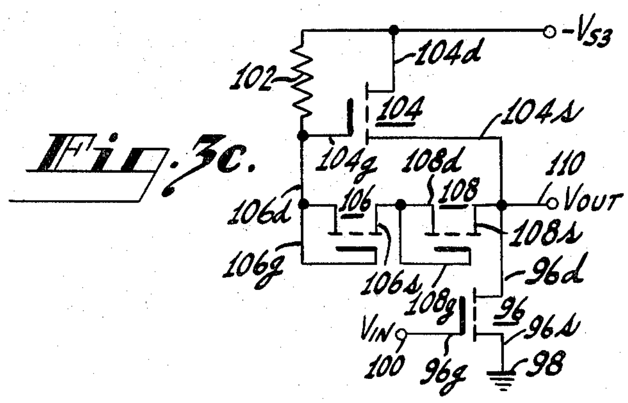
FIG. 3C is a schematic circuit diagram of a MOS FET amplifier with a MOS FET biased by another MOS FET used in combination as a load.
Figure 3D:
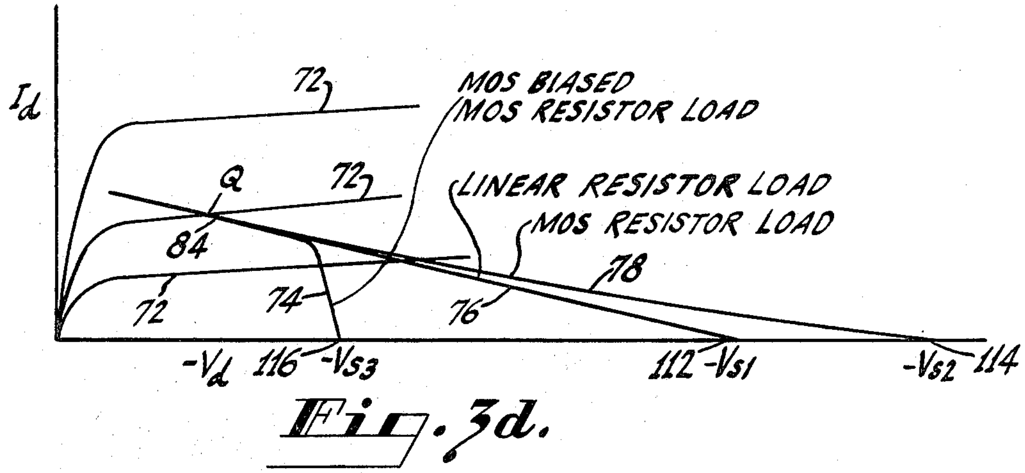

Referring to FIG. 3D of the drawing, drain characteristics 72 (i.e. drain current versus drain voltage for various values of gate voltage) are illustrated for a typical MOS FET device. Load lines 74, 76 and 78 are plotted on the drain characteristics for various loads as will be explained below.

Referring to FIG. 3A, a MOS FET amplifier known in the art, comprises a "P" channel MOS FET device 80 with a conventional resistor load 82. Input signals are supplied to gate 80*g*. Load resistor 82 is connected between an operating supply (B−) and drain 80d. Output signals are obtained between drain 80*d* and ground 85.

For typical circuit values with resistor 82 being approximately 20,000 ohms, in the FIG. 3A configuration, operation occurs about the operating point Q, shown as 84 in FIG. 3D, along the load line 76.

Referring to FIG. 3B, a further known MOS FET amplifier comprises a "P" channel FET 86 and a FET 88 functioning as a load impedance. Source 86s is connected to ground 92. The source 88*s* is connected to the drain 86*d* and to an output terminal 90. The drain 88*d* and gate 88*g* are connected in common to an operating supply (B−). Output signals are obtained between terminal 90, and ground 92 while the input signals are applied between terminal 94 and ground 92, a typical load line 78 for this amplifier is shown in FIG. 3D.

An amplifier circuit constructed in accordance with the present invention is shown in FIG. 3C. An amplifying FET 96 has its source 96*s* connected to ground 98 while its gate 96*g* is connected to terminal 100. An input signal is applied to the gate 96*g* between terminal 100 and ground 98. The load for FET 96 is comprised of resistor 102 and FET's 104, 106, and 108. A part of the load shown as a resistor 102 in FIG. 3C is a much larger value than the resistor 82 of FIG. 3A and FET 88 of FIG. 3B, and, in the embodiment of FIGS. 1 and 2, comprise a FET (e.g. 32, 33, 35) with the drain connected to the gate. One terminal of the load resistor 102 is connected to the operating supply (B−) in common with the load FET drain 104*d*. The gate 104*g* of the load FET 104 is connected to the other terminal of the load resistor 102 and to the drain 106*d*-gate 106*g* common junction. The source 106*s* of load bias FET 106 is in turn connected to the common connected gate-drain 108*g–d* of FET 108. The source 108*s* is connected to output terminal 110 which is also the junction of the source 104*s* and drain 96*d* of FET's 104 and 96 respectively. The input signal is applied between input terminal 100, (which is connected to the gate 96*g*), and ground 98. The output signal is obtained between the output terminal 110 and ground 98. In FIG. 3D, the load line 74, plotted upon the characteristic curves of the FET amplifier device 96 represents the combined effect of resistor load 102 and load FET's 104, 106, and 108.

Assuming equal amplifier gain, i.e. equal slope the load lines 74, 76 and 78 at operating point Q, it is to be noted that the supply voltage required for operation at operating point Q shown as 84 in FIG. 3D is highest for the MOS resistor load ($V_{s_2}$ at point 114), next highest for the resistive load ($V_{s_1}$ at point 112) and lowest for the MOS biased MOS resistor load ($V_{s_3}$ at point 116). The lower supply voltage insures a lower power dissipation in the amplifier and consequently better efficiency.

For a range of input voltages in the neighborhood of the operating point Q (FIG. 3D), bias FET's 106 and 108 are constructed to have a relatively small A.C. voltage drop across their source drain terminals and form a voltage divider in conjunction with the load 102. This is accomplished by having their channel width to length ratio greater than the channel width to length ratio of load 102. For these conditions, the voltage drop between drain 106*d* and source 108*s* is relatively constant and approximately equal to the sum of the threshold voltages of FET's 106 and 108, and is coupled between gate 104*g* and source 104*s* of FET 104 to cause FET 104 to represent a high drynamic resistance load for FET 96. Clamping the source to gate 104*s–g* to a fixed voltage causes a fixed DC current to flow between source and drain 104*s–d* of FET 104. Since very little AC voltage can be developed across the gate to source 104*g–d* junction substantially all the AC voltage appears across FET load impedance 102. The effective dynamic load impedance is that of the parallel combination of FET 102 and FET 104. In the ideal case, FET 104 would be a constant current source and the effective dynamic impedance would be that of load FET 102 alone. The parallel combination of FET's 102 and 104 results in a relatively high impedance load approximating the values of load FET 88, FIG 3B and resistor 82, FIG. 3A. If load 102 was utilized alone as a load for FET 96 a low source-to-drain current would flow. Since in FIG. 3C the load current for FET 96 is the sum of the currents flowing in FET 102 an 104, FET 96 is operating at a higher DC source-drain current level. FET 96 thus exhibits higher transconductance and increased signal-handling capacity without the need for increasing the supply voltage ($V_{s_3}$) to obtain this higher current level.

The shape of the load line 74 is the result of the high impedance FET 102 acting in parallel with auxiliary load FET 104. The voltage appearing at the drains 80*d*, 86*d* of FETS 80 and 86 is equal to the operating supply voltage ($-V_{s_1}$ and $-V_{s_2}$) minus the drop across the drain load 82, 88. The effective resistance of these drain loads must be relatively large, from 10 to 20 thousand ohms, to obtain a large gain. For low source-drain 80*s–d* and 86*s–d* currents a large voltage drop appears across the loads 82 and 88 respectively. As current is increased through FET's 80 and 86 the voltage drop increases in an approximately linear manner reducing the voltage appearing at the drains 80*d* and 86*d* rapidly requiring a relatively large value, 30 to 40 volts, of B− to obtain a large gain. In the present embodiments of the invention, with low source-drain 96*s–g* current values in FET 96 auxiliary load FET 104 will conduct. Since FET 104 has a low impedance value (effective resistance), which is accomplished by having its channel width to length ratio large compared to FET 102, until pinch off is reached the voltage drop across FET 104 is small thereby allowing the voltage at the drain 96*d* to remain large. As current is increased through FET 96 the pinch off current value of FET 104 is reached cuasing the AC impedance of FET 104 to increase to a larger value. FET 104 is coupled in parallel with FET load 102 (show as a resistor in FIG. 3C). The effective dynamic impedance and amplifier gain can now approximate the conventional load resistance of FET load curves 76 and 78.

Thus it has been shown that a relatively high gain, (high drain load impedance) may be obtained without the use of an increased supply voltage. For the prior art configurations shown in FIGS. 3A and 3B the supply voltages would reach the source-drain breakover point if an attempt was made to utilize the full output voltage capability by increasing the supply voltage.

The load 102 in the preferred embodiment shown in FIG. 1 is a FET (e.g. 32) designed to have a large resistance value (small channel width to length ratio) with FET's 106 and 108 (e.g. 34 and 36 in FIG. 1) designed to have a much smaller resistance value (large channel width to length ratio). Any number of units may be used for the load 102 or the bias transistors 106, 108 as long as the load impedance is much higher than the bias impedance. Thus the high resistance load 102 limits the current in the smaller resistance devices 106 and 108; FET's 106 and 108 therefore exhibit a source to drain voltage which is slightly above the threshold voltage. In this manner voltage gains of 50 or more are readily obtainable.

In the alternate embodiment of the complete amplifier, shown in FIG. 2, the feedback circuit is modified in that FET 64 has its gate 64*g* connected to the junction 62 of capacitor 60 and FET 56, which has its source 64*s* and drain 64*d* connected in common with the source 30*s* and drain 30*d* of the input amplifying FET 30. Source 64*s* is connected to ground 22. The feedback signal is coupled to the gate 64*g* of FET 64 wherein FET 64 is caused to conduct in the appropriate manner to have the similar result at point 68 as if the feedback was applied to the gate of FET 30 in the manner shown in FIG. 1.

It is also to be understood that the present invention is not limited to use by integrated circuit techniques but is also applicable to circuits designed with discrete components and that "P" channel devices may be replaced with "N" channel devices as long as consistency is maintained and the supply supplementary potentials are correspondingly reversed.

I claim:

1. A signal amplifying circuit comprising:
 amplifying means comprising a first semiconductor amplifying device having input, output, and common electrodes;
 means for coupling input signals between said common and said input electrode; and
 output load means across which output signals corresponding to amplified input signals are produced, said output load means being coupled between said output electrode and a supply terminal adapted for connection to a source of voltage and comprising:
  a second semiconductor device having a relatively high impedance;
  a third semiconductor device for providing an auxiliary conduction path;
  means coupling said third semiconductor device between said output electrode and said supply terminal; and
  biasing means coupled to said third semiconductor device for coupling said second high impedance semiconductor device in parallel with said third semiconductor device and for biasing said third semiconductor device to substantially constant current operation over a predetermined range of said input signals.

2. A signal amplifying circuit according to claim 1 wherein each of said semiconductor devices is a field-effect transistor having a source electrode, a drain electrode and a gate electrode.

3. A signal amplifying circuit according to claim 2 wherein said input, output, and common electrodes correspond respectively to gate, drain, and source electrodes of said amplifying device; said auxiliary conduction path corresponds to the source-drain path of said third semiconductor load device; and said biasing means is coupled between the gate and source of said third load device.

4. A signal amplifying circuit according to claim 3 wherein said drain and gate electrodes of said second device are directly connected together.

5. A signal amplifying circuit according to claim 4 wherein said biasing means comprises at least one additional field-effect transistor having drain and gate electrodes connected directly together and to the gate of said third semiconductor device, and a source electrode connected to the source of said third semiconductor device.

6. A signal amplifying circuit according to claim 4 wherein said biasing means comprises a plurality of field-effect transistors each having source, gate, and drain electrodes, the gate and drain electrodes being connected together, the connected gate-drain of a first of said transistors being connected to the gate of said third semiconductor device and the source electrode of a last of said transistors being connected to the source of said third semiconductor device, the source electrode of said first and succeeding transistors other than said last being connected to the connected gate and drain electrodes of a next succeeding transistor.

7. A signal amplifying circuit according to claim 6 wherein said plurality of field-effect transistors are connected in series with said second semiconductor device for biasing said third semiconductor device to substantially constant current operation.

8. A signal amplifying circuit according to claim 7 wherein said field-effect transistors are enhancement type, insulated gate, metal-oxide semiconductor field-effect transistors.

9. A signal amplifying circuit comprising:
 amplifying means comprising a first metal-oxide semiconductor field-effect transistor having source, gate and drain electrodes;
 means for coupling input signals between said source and said gate electrode; and
 output load means across which output signals corresponding to amplified input signals are produced, said output load means being coupled between said drain electrode and a supply terminal adapted for connection to a source of voltage and comprising:
  a second metal-oxide semiconductor field-effect transistor having source, drain and gate electrodes for providing a relatively high impedance,
  a third metal-oxide semiconductor field-effect transistor having source, gate, and drain electrodes for providing an auxiliary conduction path,
  means coupling said source and drain of said third field-effect transistor between said drain electrode of said first field-effect transistor and said supply terminal; and
  biasing means coupled to said gate and source of said third field-effect transistor for coupling said source and drain of said second field-effect transistor in parallel with said source and drain of said third field-effect transistor and for biasing said gate and drain of said third field-effect transistor to produce substantially constant source-drain current operation of said third transistor over a predetermined range of said input signals.

10. A signal amplifying circuit according to claim 9 wherein said biasing means comprises a field-effect transistor having source, drain, and gate electrodes, said gate and drain electrodes being connected together and coupled in a series path including said second field-effect transistor between said supply terminal and the drain electrode of said first field-effect transistor.

11. A signal amplifying circuit according to claim 10 wherein said gate and drain electrodes of said second field-effect transistor are connected together and coupled to the drain electrode of said third field-effect transistor and to said supply terminal, the gate of said third field-effect transistor being coupled to the junction of the source electrode of said second field-effect transistor and the drain electrode of said fourth field-effect transistor connected in series, the source electrode of said third field-effect transistor being coupled to the drain electrode of said first electrode.

12. A signal amplifying circuit according to claim 11 wherin said biasing means comprises a plurality of field-effect transistors, each having source, gate, and drain electrodes, the gate and drain electrodes being connected together, the connected gate-drain of a first of said transistors being connected to the gate of said third field-effect transistor and the source electrode of a last of said field-effect transistors being connected to the source of said third field-effect transistor, the source electrode of said first and succeeding field-effect transistors other than said last being connected to the connected gate and drain electrodes of a next succeeding transistor.

* * * * *